(12) United States Patent
Holt et al.

(10) Patent No.: US 11,177,347 B2
(45) Date of Patent: Nov. 16, 2021

(54) HETEROJUNCTION BIPOLAR TRANSISTOR

(71) Applicant: GLOBALFOUNDRIES U.S. INC., Santa Clara, CA (US)

(72) Inventors: Judson R. Holt, Ballston Lake, NY (US); Vibhor Jain, Williston, VT (US); Qizhi Liu, Lexington, MA (US); John J. Pekarik, Underhill, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/830,783

(22) Filed: Mar. 26, 2020

(65) Prior Publication Data

US 2021/0091183 A1 Mar. 25, 2021

Related U.S. Application Data

(60) Provisional application No. 62/904,433, filed on Sep. 23, 2019.

(51) Int. Cl.
| | |
|---|---|
| *H01L 29/10* | (2006.01) |
| *H01L 29/08* | (2006.01) |
| *H01L 29/66* | (2006.01) |
| *H01L 29/737* | (2006.01) |
| *H01L 29/16* | (2006.01) |

(52) U.S. Cl.
CPC ...... *H01L 29/1004* (2013.01); *H01L 29/0817* (2013.01); *H01L 29/0821* (2013.01); *H01L 29/16* (2013.01); *H01L 29/66242* (2013.01); *H01L 29/737* (2013.01)

(58) Field of Classification Search
CPC ............. H01L 29/1004; H01L 29/0817; H01L 29/66242; H01L 29/737; H01L 29/16; H01L 29/0821
See application file for complete search history.

(56) References Cited

U.S. PATENT DOCUMENTS

| | | | | |
|---|---|---|---|---|
| 5,340,753 | A * | 8/1994 | Bassous | H01L 29/1004 148/DIG. 11 |
| 2004/0012036 | A1* | 1/2004 | Kotani | H01L 29/66318 257/197 |

* cited by examiner

*Primary Examiner* — Syed I Gheyas
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to heterojunction bipolar transistors and methods of manufacture. The structure includes a collector region composed of semiconductor material; at least one marker layer over the collector region; a layer of doped semiconductor material which forms an extrinsic base and which is located above the at least one marker layer; a cavity formed in the layer of doped semiconductor material and extending at least to the at least one marker layer; an epitaxial intrinsic base layer of doped material located within the cavity; and an emitter material over the epitaxial intrinsic base layer and within an opening formed by sidewall spacer structures.

20 Claims, 11 Drawing Sheets

US 11,177,347 B2

HETEROJUNCTION BIPOLAR TRANSISTOR

FIELD OF THE INVENTION

The present disclosure relates to semiconductor structures and, more particularly, to heterojunction bipolar transistors and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance (Ccb), low base resistance (Rb), high cut-off frequencies (fT/fMAX) and high breakdown voltage (BVceo).

In high performance Si/SiGe HBT technologies, the emitter is almost universally formed inside of a hole etched into the extrinsic base layer. This results in complicated integration schemes for self-aligned emitter-base junction due to lack of an etch-stop layer for the extrinsic base etch during emitter formation. An emitter-before-extrinsic base integration architecture can resolve some of these issues but results in a non-self-aligned emitter base junction. Self-aligned schemes with emitter first face many challenges including, e.g.: lack of an end-point signal for the emitter etch due to the sparse and varying emitter pattern; difficult process schemes to form spacers, which separate the emitter and the base; and an uneven top surface on which to form a contact to the emitter. Also, some integration schemes can result in high Ccb (parasitic capacitance) and high Rb, which is a concern in bipolar technologies as it limits device scaling for improved fT/fMAX.

SUMMARY

In an aspect of the disclosure, the structure comprises: a collector region composed of semiconductor material; at least one marker layer over the collector region; a layer of doped semiconductor material which forms an extrinsic base and which is located above the at least one marker layer; a cavity formed in the layer of doped semiconductor material and extending at least to the at least one marker layer; an epitaxial intrinsic base layer of doped material located within the cavity; and an emitter material over the epitaxial intrinsic base layer and within an opening formed by sidewall spacer structures.

In an aspect of the disclosure, a structure comprising: a substrate; a plurality of layers of epitaxially semiconductor material over the substrate with at a lower layer of the plurality of layers of epitaxially semiconductor material having a different removal selectivity to at least an upper layer of the plurality of layers of epitaxially semiconductor material; a cavity formed in at least the upper layer of the plurality of layers of epitaxially grown semiconductor material; an intrinsic base material formed within the cavity; and an emitter material formed over the intrinsic base material.

In an aspect of the disclosure, a method comprises: forming a plurality of layers of epitaxially semiconductor material over a substrate with a lower layer of the plurality of layers of epitaxially semiconductor material having a different removal selectivity to at least an upper layer of the plurality of layers of epitaxially semiconductor material; forming a cavity formed in at least the upper layer of the plurality of layers of epitaxially grown semiconductor material; forming an intrinsic base material within the cavity; and forming an emitter material over the intrinsic base material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to heterojunction bipolar transistors and methods of manufacture. More specifically, the present disclosure is directed to a high performance SiGe heterojunction bipolar transistor with semiconductor material within a recess and/or cavity, and a selective epitaxial SiGe base. Advantageously, the heterojunction bipolar transistors provide improved, e.g., lower, collector-base capacitance (Ccb), while also providing improved process controls.

In embodiments, the SiGe heterojunction bipolar transistor includes a lateral intrinsic base and extrinsic base connection where the SiGe intrinsic base is formed by selective epitaxy in a cavity (or recess) surrounded by single crystal silicon with a SiGe marker layer below the base. The cavity depth is controlled by the SiGe marker layer which can act as an etch stop layer. In embodiments, the cavity depth is controlled by incorporating etch stop layers (e.g., SiGe marker layer) for the Si recess etch. In more specific embodiments, the SiGe base layer is formed by Si recess and selective epi regrowth. The SiGe layer in the extrinsic base reduces extrinsic base diffusion into the collector for lower Ccb. In further embodiments, the extrinsic base can be a highly doped extrinsic base, and there can be variations in recess depth using multiple marker layers for different heterojunction bipolar transistor schemes.

The heterojunction bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the heterojunction bipolar transistor of the present disclosure have been adopted from integrated circuit (IC) technology. For example, the structures are built on wafers and are realized in films of material patterned by photolithographic processes on the top of a wafer. In particular, the fabrication of the heterojunction bipolar transistor uses three basic building blocks: (i) deposition of thin films of material on a substrate, (ii) applying a patterned mask on top of the films by photolithographic imaging, and (iii) etching the films selectively to the mask.

Figure 1:
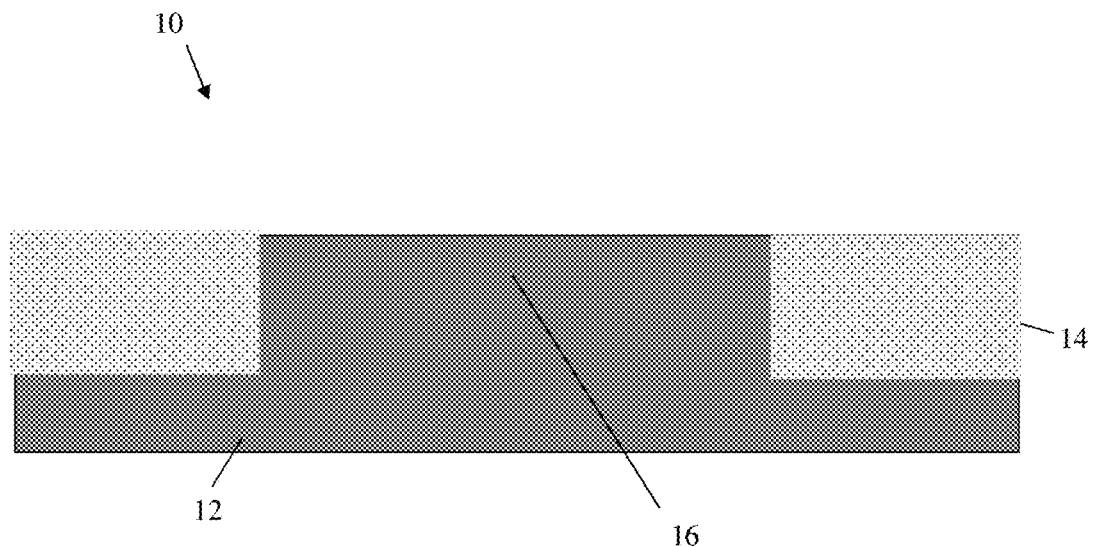
FIG. 1 shows a substrate with shallow trench isolation structures and respective fabrication processes in accordance with aspects of the present disclosure.

FIG. 1 shows a starting substrate in accordance with aspects of the present disclosure. More specifically, in embodiments, the structure 10 includes a substrate 12 composed of semiconductor material. In embodiments, the substrate 12 is bulk Si; although other semiconductor materials are contemplated herein, e.g., SiGeC, SiC, GaAs, InAs, InP, and other III/V or II/VI compound semiconductors. In one example, the substrate 12 can be embedded within semiconductor on insulator technologies. In such an embodiment, an insulator material is located on a semiconductor wafer. The insulator material comprises any suitable material including buried oxide layer (BOX), silicon oxide, sapphire, other suitable insulating materials, and/or combinations thereof. A semiconductor material is formed on the insulator material.

Still referring to FIG. 1, the substrate 12 can be subjected to a doping process to form a sub-collector region of a heterojunction bipolar transistor. The sub-collector region can be a highly doped n-type region, i.e., phosphorus or arsenic, formed by ion implantation processes or other known diffusion processes. In embodiments, the sub-collector region can also be formed from a heavily doped epitaxy layer of material grown on the substrate 12.

More specifically, the sub-collector region of the substrate 12 and other doped features can be formed by introducing a dopant by, for example, ion implantation that introduces a concentration of dopant in the substrate. In embodiments, for any implantation processes described herein, respective patterned implantation masks may be used to define selected areas exposed for the implantations. The implantation mask used to select the exposed area for forming well is stripped after implantation, and before the implantation mask used to form well. Similarly, the implantation mask used to select the exposed area for forming the well is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. Different dopant types are contemplated herein including P-type dopants, e.g., Boron (B), and n-type dopants, e.g., Arsenic (As), Phosphorus (P) and Sb, among other suitable examples.

FIG. 1 further shallow trench isolation structures 14 formed in the substrate 12. A collector region 16 is provided between the shallow trench isolation structures 14. In embodiments, the shallow trench isolation structures 14 can be formed by conventional lithography, etching and deposition methods known to those of skill in the art. For example, a resist formed over the substrate 12 exposed to energy (light) to form a pattern (opening). An etching process with a selective chemistry, e.g., reactive ion etching (RIE), will be used to form one or more trenches in the substrate 12 through the openings of the resist. Following the resist removal with conventional oxygen ashing processes or other known stripants, insulator material, e.g., oxide material, can be deposited in the trenches by any conventional deposition processes, e.g., chemical vapor deposition (CVD) processes. Any residual material on the surface of the semiconductor material 12 can be removed by conventional chemical mechanical polishing (CMP) processes.

Figure 2:
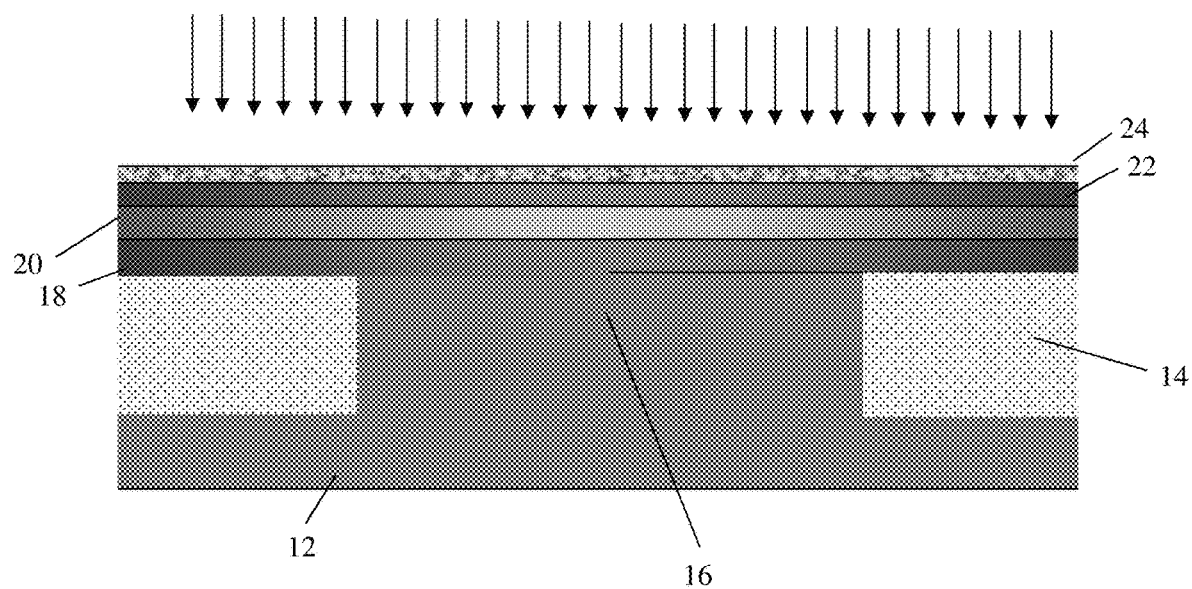
FIG. 2 shows epitaxial semiconductor materials including an intrinsic base, amongst other features, and respective fabrication processes in accordance with aspects of the present disclosure.

FIG. 2 shows epitaxial semiconductor materials including an intrinsic base, amongst other features, and respective fabrication processes in accordance with aspects of the present disclosure. In FIG. 2, an undoped semiconductor material 18 is formed on the substrate 12 and shallow trench isolation structures 14. The undoped semiconductor material 18 is preferably Si material. As should be understood by those of ordinary skill in the art, the undoped semiconductor material 18 will grow as single cyrstalline material on the semiconductor material 12; whereas, polysilicon material will form over the oxide regions of the shallow trench isolation structures 16.

Still referring to FIG. 2, a semiconductor material 20 is grown on the undoped semiconductor material 18. In embodiments, the semiconductor material is epitaxial SiGe material grown over the undoped semiconductor material 18, e.g., both the single crystalline semiconductor material and the polysilicon material, resulting in single crystalline SiGe material (over the single crystalline semiconductor material) and polysilicon SiGe material (over the polysilicon material). In embodiments, the SiGe can have a concentration of approximately 10% or more of Ge, with a thickness of about 50 Å. As further described herein, the epitaxial SiGe material 20 will act as a marker or etch stop layer by providing an endpoint signal indicating that an etching process should stop.

FIG. 2 further shows an epitaxial semiconductor material 22 grown on the epitaxial SiGe material 20. In embodiments, the epitaxial semiconductor material 22 can be implanted at a high dose and low energy with a p-type material, e.g., boron, or be epitaxially doped, both of which will form a doped layer 24. In either the doping or ion implantation process, the doped material 24 will be used as an extrinsic base of the heterojunction bipolar transistor. In embodiments, the epitaxial semiconductor material 22 is Si material. And, as should be understood by those of ordinary skill in the art, the epitaxial semiconductor material 22 will grow as a single crystalline semiconductor material (over the single crystalline SiGe semiconductor material) and polysilicon material (over the polysilicon SiGe material).

Figure 3:
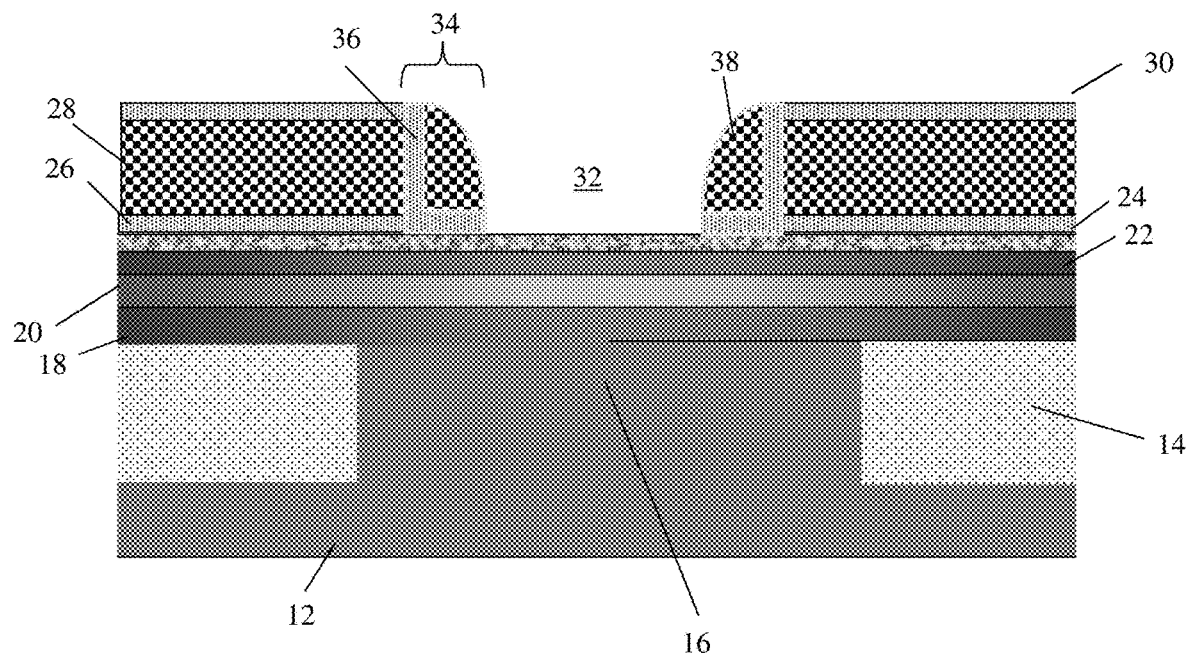
FIG. 3 shows sidewall spacer structures aligned to a collector region, amongst other features, and respective fabrication processes in accordance with aspects of the present disclosure.

FIG. 3 shows sidewall spacer structures 34 aligned to a collector region 16, amongst other features, and respective fabrication processes in accordance with aspects of the present disclosure. In FIG. 3, insulator materials 26, 28, 30 are deposited over the epitaxial semiconductor material 22, 24. In embodiments, the insulator materials can be, e.g., an oxide material 26 deposited on the epitaxial semiconductor material 22, followed by a nitride material 28 and another oxide material 30. The insulator materials 26, 28, 30 can be deposited by conventional deposition methods, e.g., chemical vapor deposition (CVD) processes.

A trench 32 is formed in the insulator materials 26, 28, 30 using conventional lithography and etching methods known to those of skill in the art. For example, a resist formed over the insulator material 30 is exposed to energy (light) to form a pattern (opening). An etching process with a selective chemistry, e.g., RIE, will be used to form the trench 32 in the insulator materials 26, 28, 30, stopping on the doped layer 24 of the epitaxial semiconductor material 22. The resist can then be removed by a conventional oxygen ashing process or other known stripants.

Following resist removal, sidewall spacer structures 34 are formed on the sidewalls of the trench 34. The sidewall spacer structures 34 are composed of different insulator materials 36, 38. For example, the different insulator materials are an oxide material 36 and a nitride material 38. The sidewall spacer structures 34 can be formed by a conventional deposition process, followed by an anisotropic etching process which will remove the insulator materials from horizontal surfaces of the structure and which will result in exposure of the underlying doped layer 24 of the epitaxial semiconductor material 22.

Figure 4:
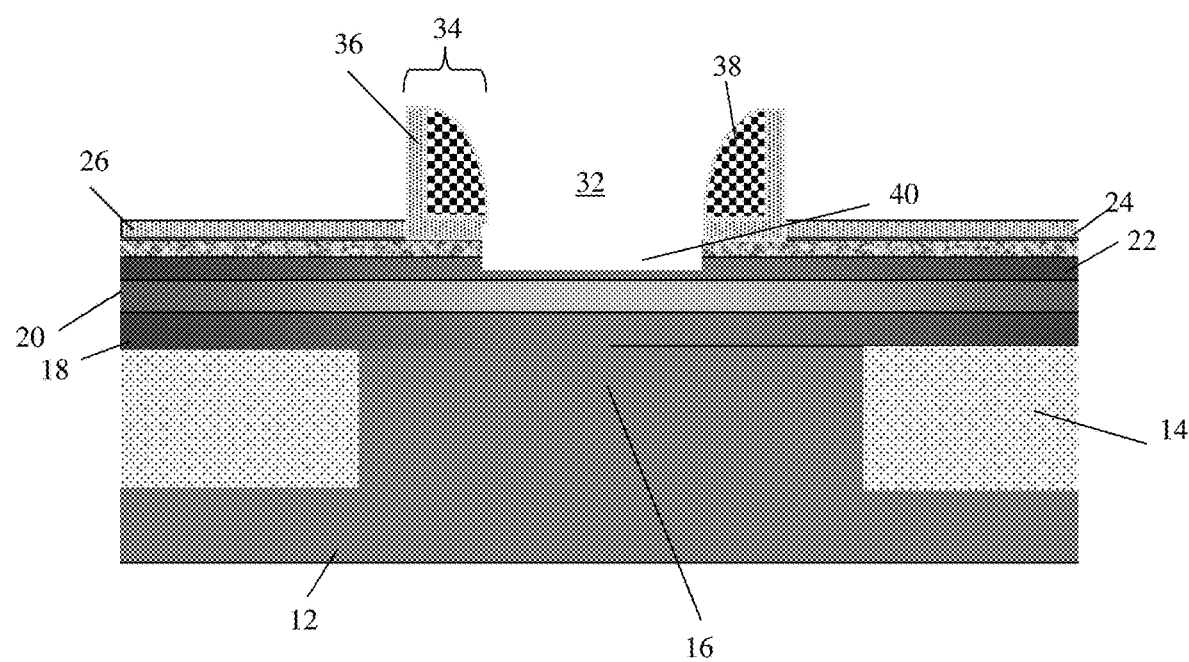
FIG. 4 shows a recess formed in semiconductor material between the sidewall spacer structures, amongst other features, in accordance with aspects of the present disclosure.

In FIG. 4, the insulator materials 28, 30 are removed by an etching process, while protecting the material 36, 38 of the sidewall spacer structures 34 with a mask, for example. In embodiments, a hot phosphorous treatment can be provided on the insulator material 26 as a touch up process, e.g., to remove any excess nitride material over the oxide material. Following the optional touch up process, a recess 40 is formed within the epitaxial semiconductor material 22 using a conventional etching process. In this processing stage, the etching process will remove the layer of doped material 24 of the epitaxial semiconductor material 22, but will not extend to the epitaxial SiGe material 20.

Figure 5A:
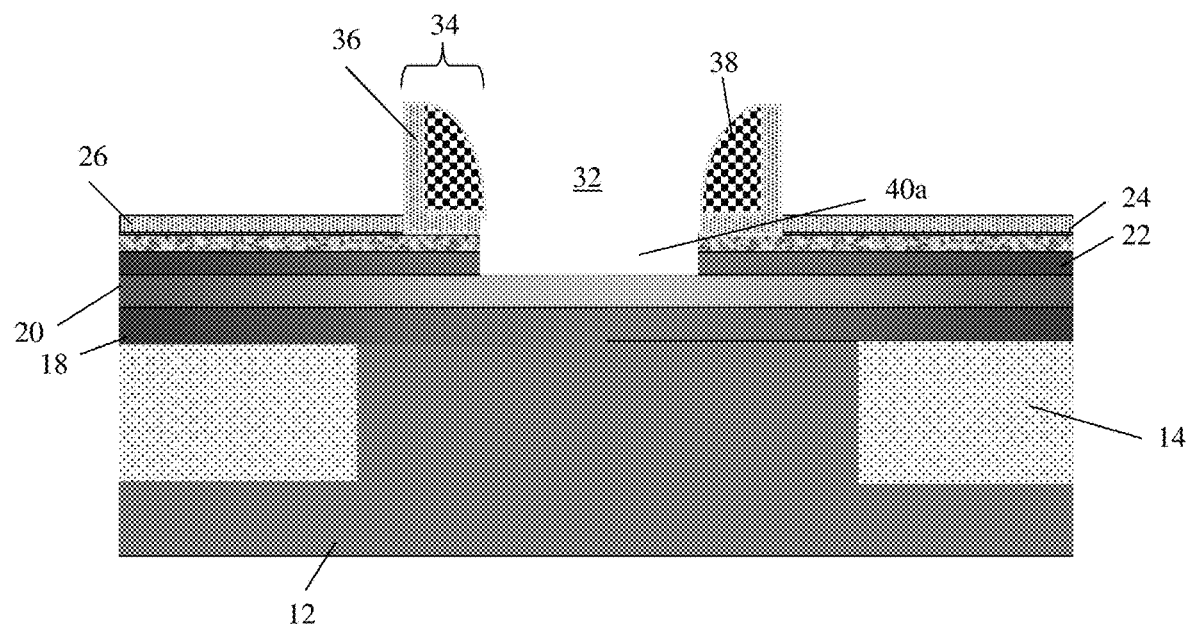
FIGS. 5A and 5B show cavity structures of different depths, amongst other features, in accordance with aspects of the present disclosure.
Figure 5B:
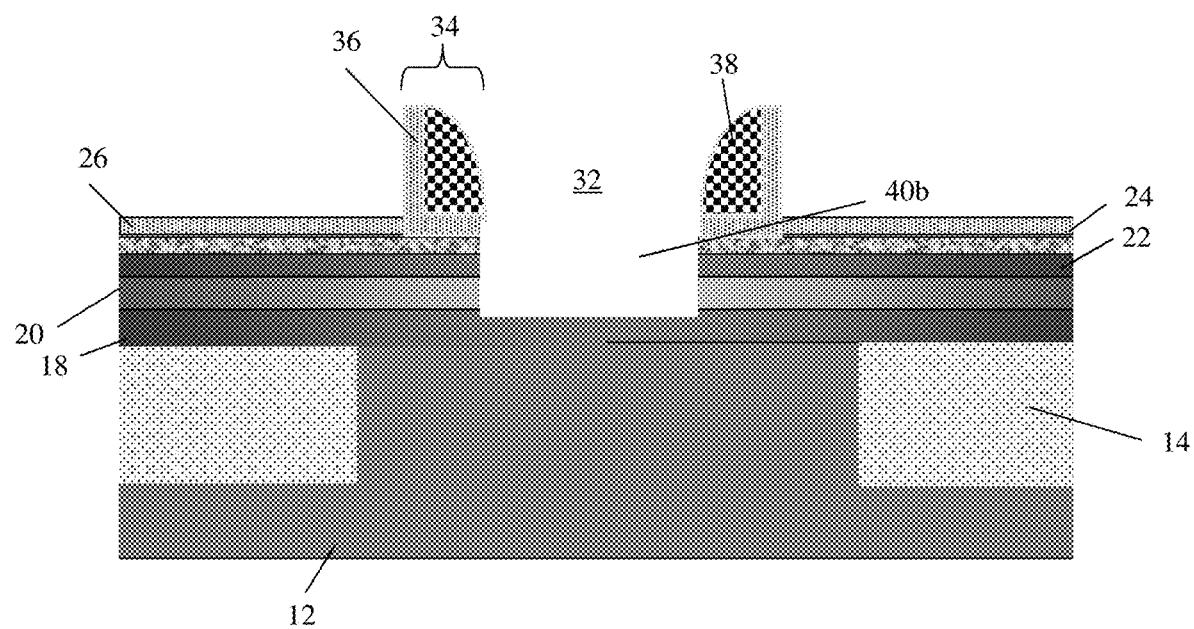

FIGS. 5A and 5B show cavity structures of different depths, amongst other features, in accordance with aspects of the present disclosure. In FIG. 5A, for example, the recess is extended to form a cavity 40a extending to and stopping at the epitaxial SiGe material 20, e.g., marker layer. As noted already, the epitaxial SiGe material 20 can provide an endpoint signal indicating that the etch process should stop. In embodiments, the cavity 40a is formed by, for example, KOH or ammonia based wet chemical etch processes. It should be understood by those of skill in the art that for (100) crystalline substrate, the side wall would be at an orientation of (111).

In FIG. 5B, a deeper cavity 40b is extended into the epitaxial semiconductor material 18, e.g., extending past the epitaxial SiGe material 20. In this alternative embodiment, the cavity 40b is formed by, for example, KOH or ammonia based wet chemical etch processes to the epitaxial SiGe material 20, followed by an added selective etch to remove epitaxial SiGe material 20 using either selective RIE or wet chemical etch processes as described further herein, a combination of these cavities 40a, 40b can be used in a single structure to tune the performance of different heterojunction bipolar transistors.

Figure 6:
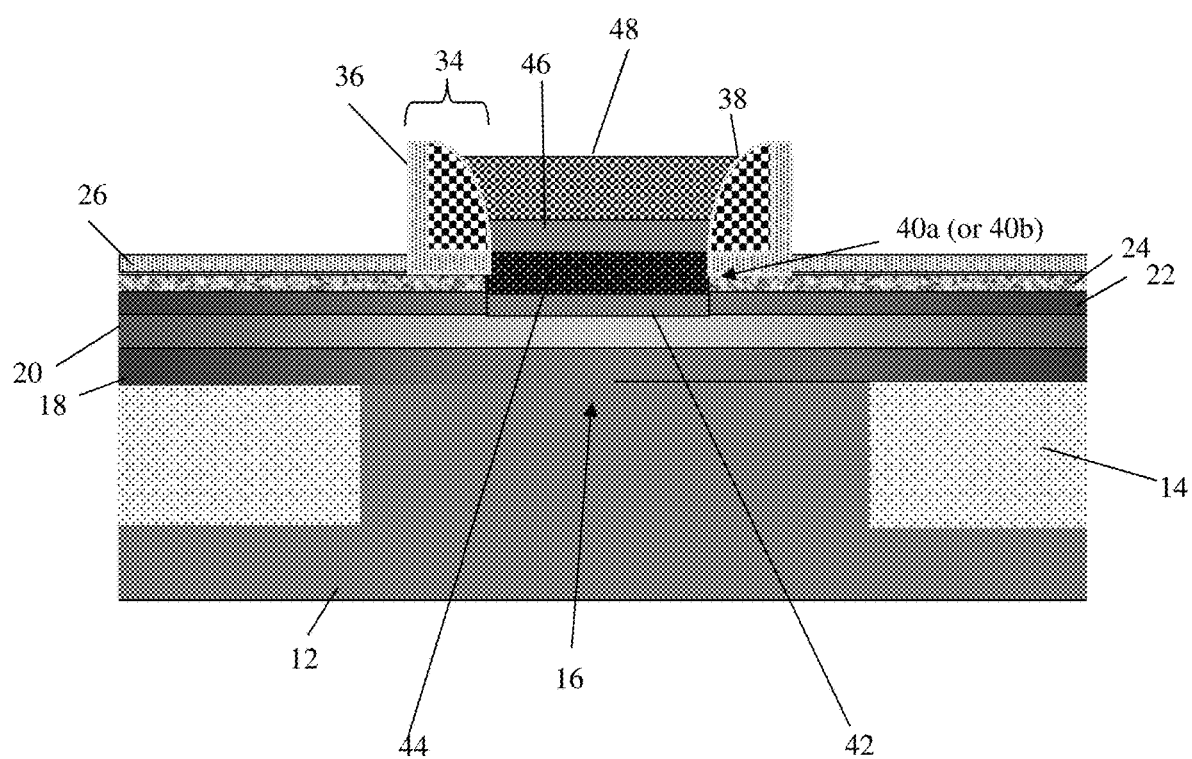
FIG. 6 shows a base and emitter formed within an opening between the sidewall spacer structures and a cavity within semiconductor material, amongst other features, in accordance with aspects of the present disclosure.

FIG. 6 shows a base 44 and emitter 48 formed within an opening between the sidewall spacer structures 34 and within the cavity 40a or 40b, amongst other features, in accordance with aspects of the present disclosure. In FIG. 6, the base 44 and emitter 48 are formed by epitaxial processes within the opening 38 between the sidewall spacer structures 34 and within the cavity 40a, 40b. In this processing scheme, an undoped semiconductor material 42 is epitaxially grown on the epitaxial SiGe material 20 (or if removed, on the semiconductor material 20) within the cavity 40a, 40b. The base 44 (e.g., intrinsic base) is formed on the undoped semiconductor material 42 by epitaxially growing semiconductor material, e.g., SiGe material, on the undoped semiconductor material 42. In embodiments, the intrinsic base 44, e.g., SiGe material, can be n-doped epitaxial material, intrinsic material or subjected to an ion implantation process. As further shown in FIG. 6, the intrinsic base 44 and the extrinsic base 24 are laterally connected together.

Still referring to FIG. 6, a semiconductor material 46 is grown on the SiGe material, e.g., intrinsic base 44. The semiconductor material 46 is undoped Si material, for example. The emitter 48 is formed on the semiconductor material 46 by epitaxially growing semiconductor material. In embodiments, the emitter 48 can be a doped Si material, e.g., N+ doped Si material. As should be understood by those of ordinary skill in the art, the epitaxial growth process for materials 42, 44, 46, 48 is a selective growth process, which will not nucleate on the insulator material 26. Hence, the growth process of the materials 42, 44, 46, 48 is limited to within the opening between the sidewall spacer structures 34.

Figure 7:
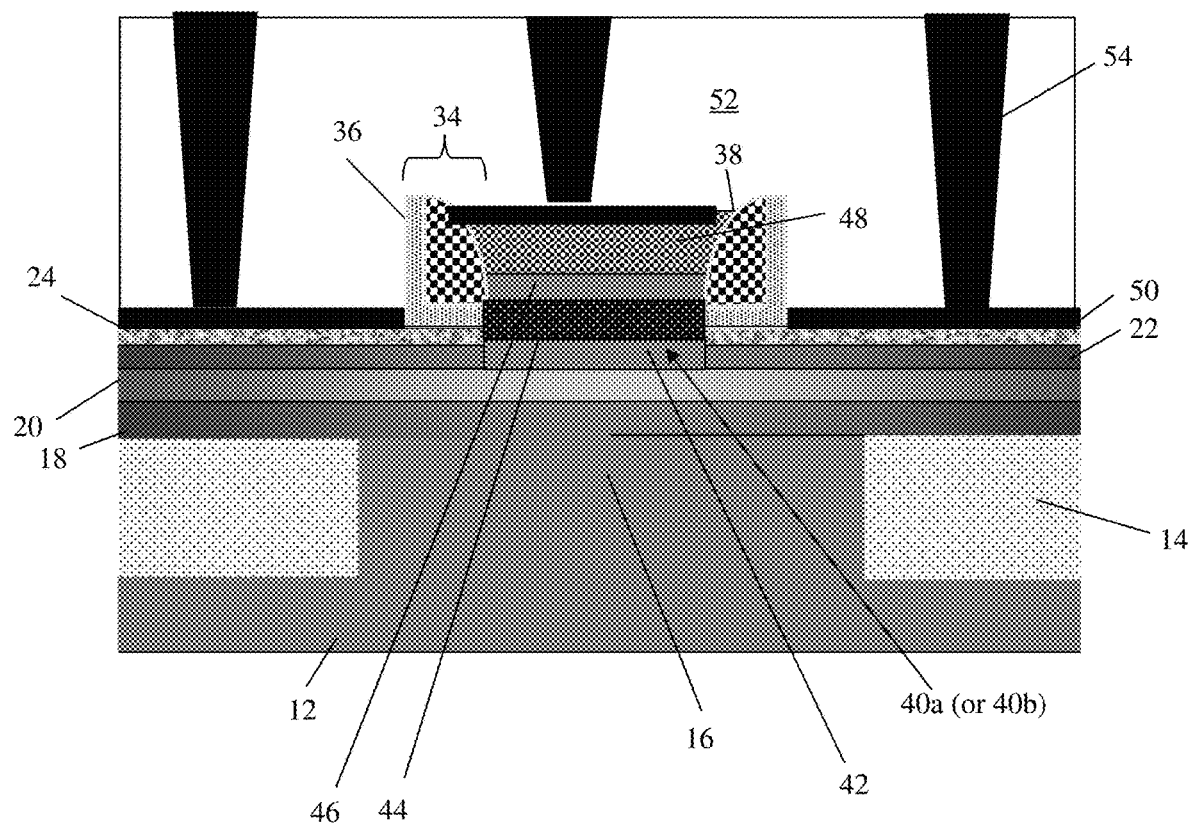
FIG. 7 shows a heterojunction bipolar transistor with contacts to the emitter and extrinsic base, amongst other features, in accordance with aspects of the present disclosure.

FIG. 7 shows contacts 54 formed to the emitter 48 and extrinsic base 24. Prior to contact formation, the insulator material 26 is removed by a conventional etching process. Thereafter, silicide contacts 50 are formed by a silicide process which begins with deposition of a thin transition metal layer, e.g., nickel, cobalt or titanium, over the exposed semiconductor materials. After deposition of the transition metals, the structure is heated allowing the transition metal to react with exposed silicon (or other semiconductor material as described herein) forming a low-resistance transition metal silicide contacts 50. Following the reaction, any unwanted remaining transition metal can removed by chemical etching, leaving silicide contacts 50.

A dielectric material 52 is deposited over the structure, followed by lithography, etching and deposition processes (e.g., metallization process). For example, the dielectric material 52 is deposited by a CVD process, followed by lithography and etching (e.g., RIE) processes to form trenches within the dielectric material 52. A metal material, e.g., aluminum or tungsten, is deposited within the trenches to form the contacts 54, e.g., collector contact, emitter region contact and extrinsic base contact. Any residual metal material can be removed from the surface of the dielectric material 52 by a conventional chemical mechanical planarization process.

Figure 8:
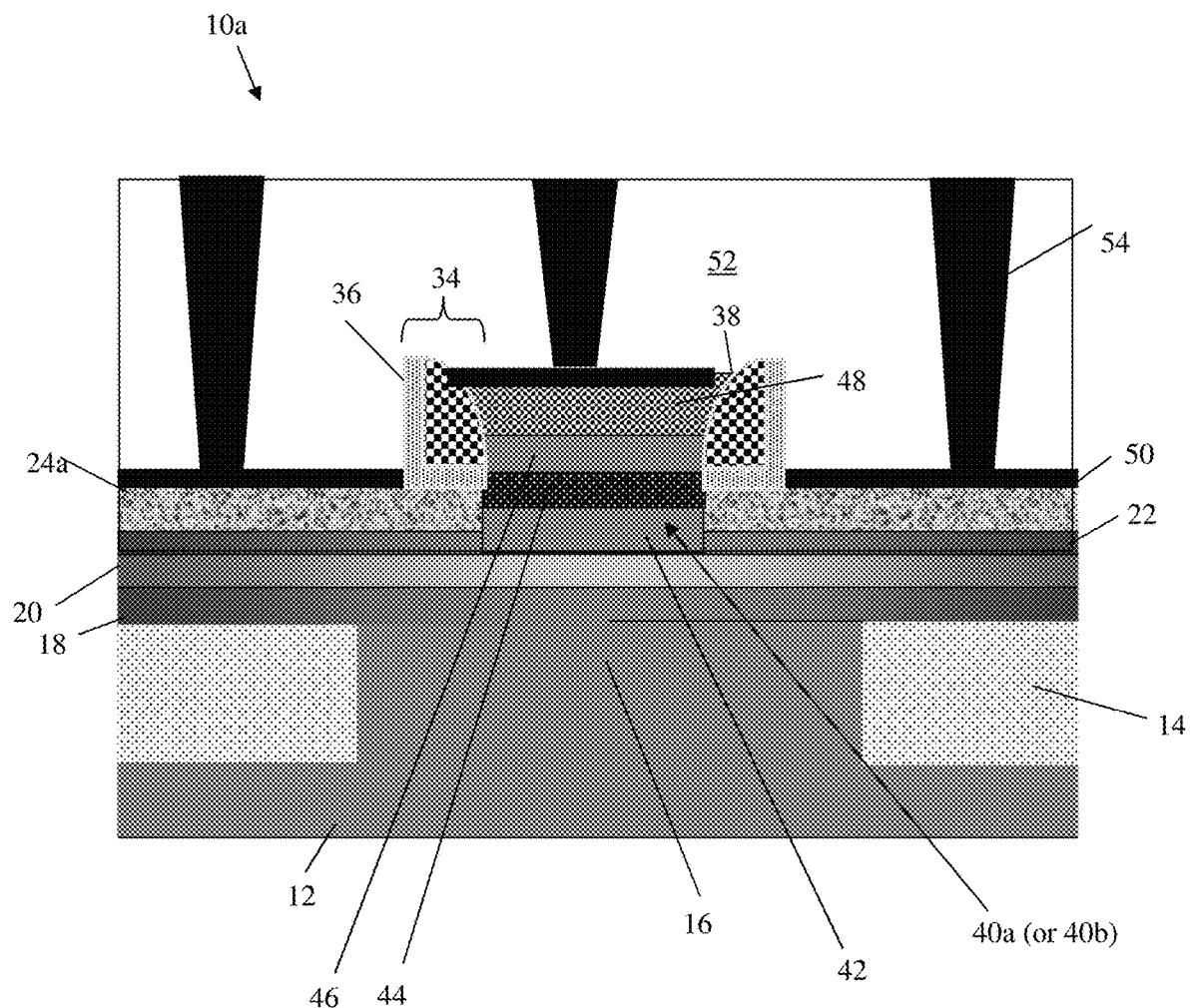
FIG. 8 shows a heterojunction bipolar transistor with a raised extrinsic base under sidewall spacer structures, amongst other features, in accordance with additional aspects of the present disclosure.

FIG. 8 shows a heterojunction bipolar transistor 10a with a raised extrinsic base 24a under the sidewall spacer structures 34, amongst other features. In embodiments, the raised extrinsic base 24a is p-doped epitaxial semiconductor material formed by an in-situ growth process over the epitaxial semiconductor material 22, prior to the formation of the sidewall spacer structures 34. As previously noted, the intrinsic base 44 and the extrinsic base 24*a* are lateral structures laterally connected together.

Figure 9:
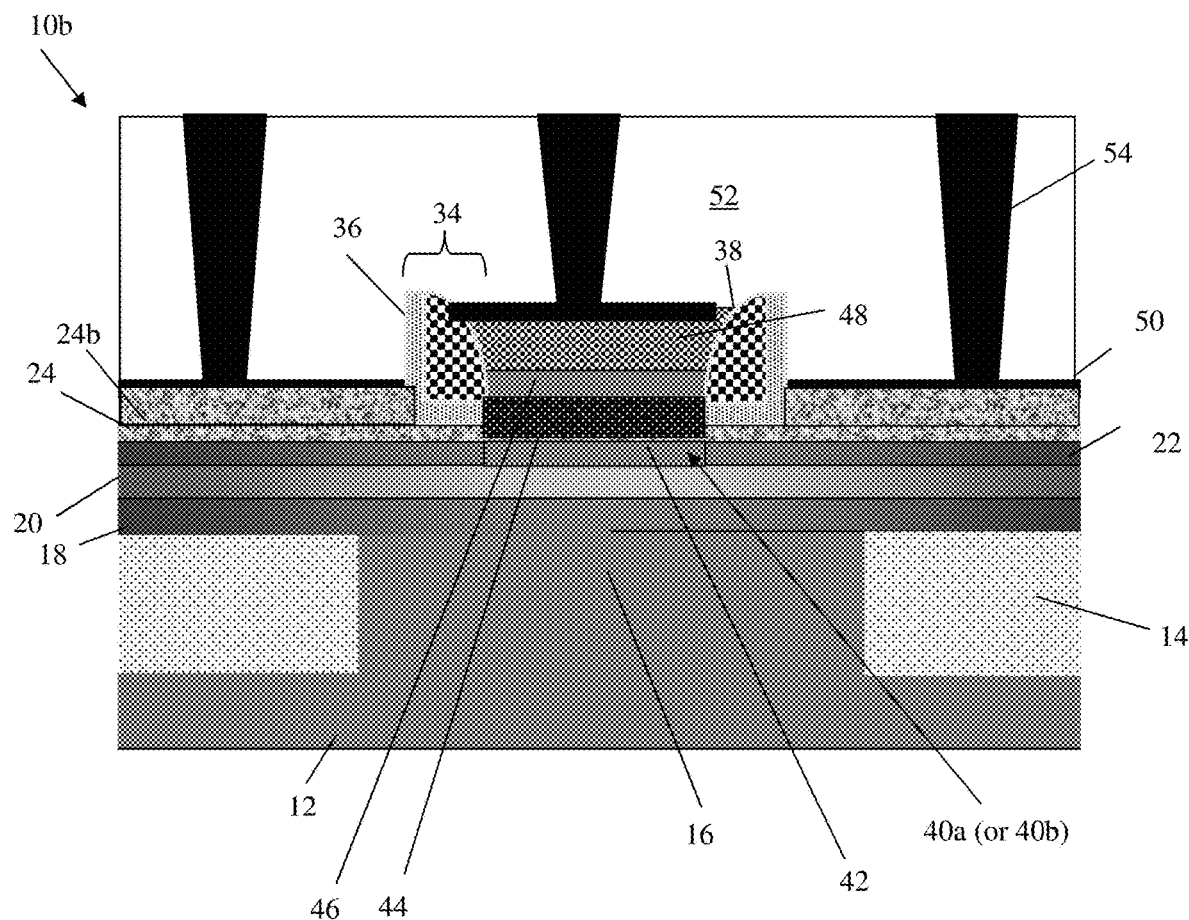
FIG. 9 shows a heterojunction bipolar transistor with a raised extrinsic base adjacent to sidewall spacer structures, amongst other features, in accordance with additional aspects of the present disclosure.

FIG. 9 shows a heterojunction bipolar transistor 10*b* with a raised extrinsic base 24*b* adjacent to the sidewall spacer structures 34, amongst other features. In this structure 10*b*, the raised extrinsic base 24*b* is formed after the formation of the sidewall spacer structures 34 and intrinsic base 44 and emitter 48, but prior to contact formation. In particular, after the removal of the insulator material 26, a mask is provided on the emitter 48 to prevent semiconductor growth in this region. The raised extrinsic base 24*b* is then grown on the exposed semiconductor material 22 (e.g., doped layer 24) by an epitaxial growth process with a p-doped Si semiconductor material, in situ. After the epitaxial growth process, the mask is removed and the contact process begins, e.g., as shown in FIG. 7.

Figure 10:
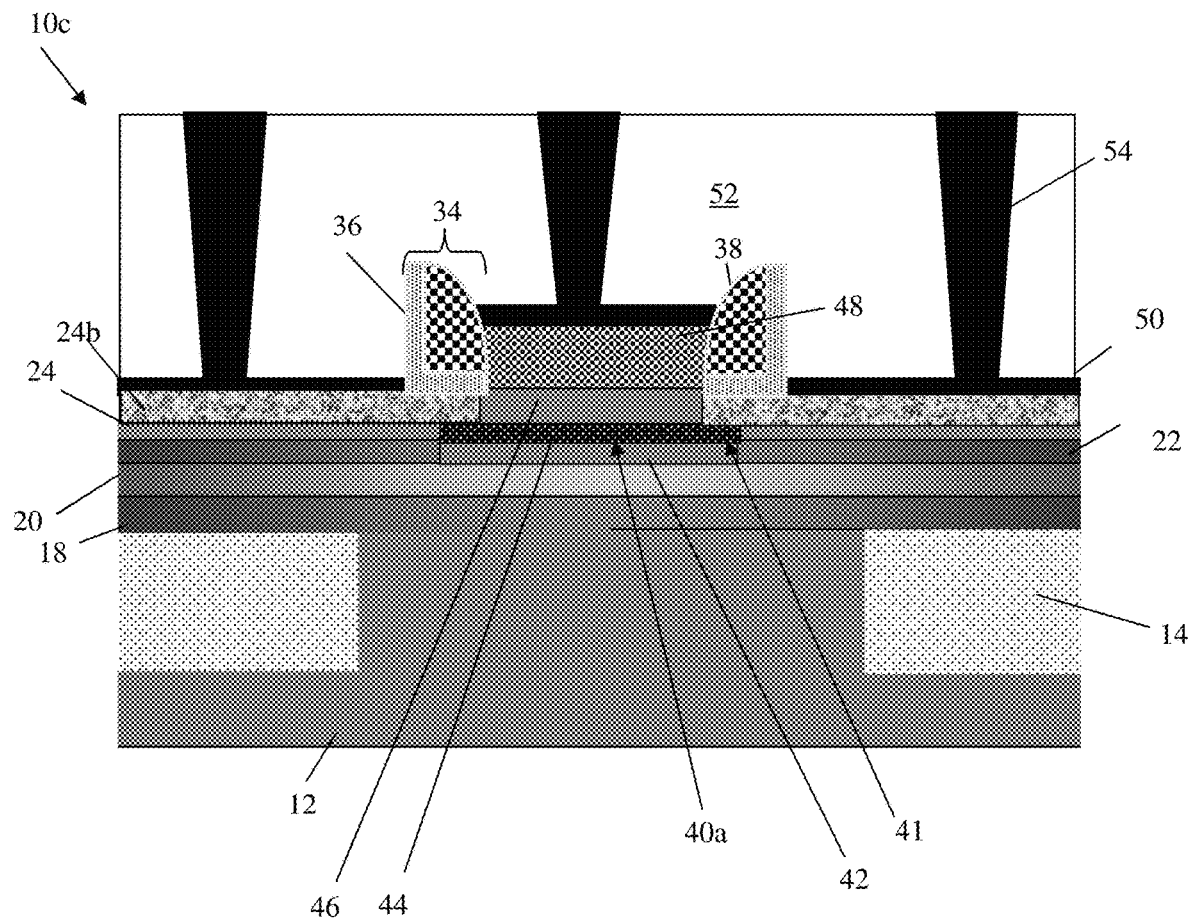
FIG. 10 shows a heterojunction bipolar transistor with an undercut under the raised extrinsic base, amongst other features, in accordance with additional aspects of the present disclosure.

FIG. 10 shows a heterojunction bipolar transistor 10*c* with a lateral undercut 41 under the raised extrinsic base 24*b*, amongst other features. In this embodiment and similar to the structure shown in FIG. 9, the heterojunction bipolar transistor includes a raised extrinsic base 24*b* which is provided after the formation of the intrinsic base 44 and emitter 48, and prior to contact formation. In this embodiment, though, the cavity 40*a* includes a lateral undercut 41 formed by an over-etch of the epitaxial semiconductor material 22. In this etching process, the etch chemistry is selective and will not attack either the raised extrinsic base 24*b* or the marker layer, e.g., epitaxial SiGe material 20, due to their material composition, e.g., Ge material, of these materials. In this way, the etch of the cavity 40*a* and lateral undercut 41 will stop on the marker layer, e.g., layer of epitaxial SiGe material 20.

Still referring to FIG. 10, an epitaxially semiconductor material 42 is grown on the epitaxial SiGe material 20, including within the cavity 40 and lateral undercut 41. The intrinsic base material 44, e.g., undoped SiGe material is epitaxially grown on the semiconductor material 42, also within the lateral undercut 41. The processes then continues with emitter and contact formation, as already described herein.

Figure 11:
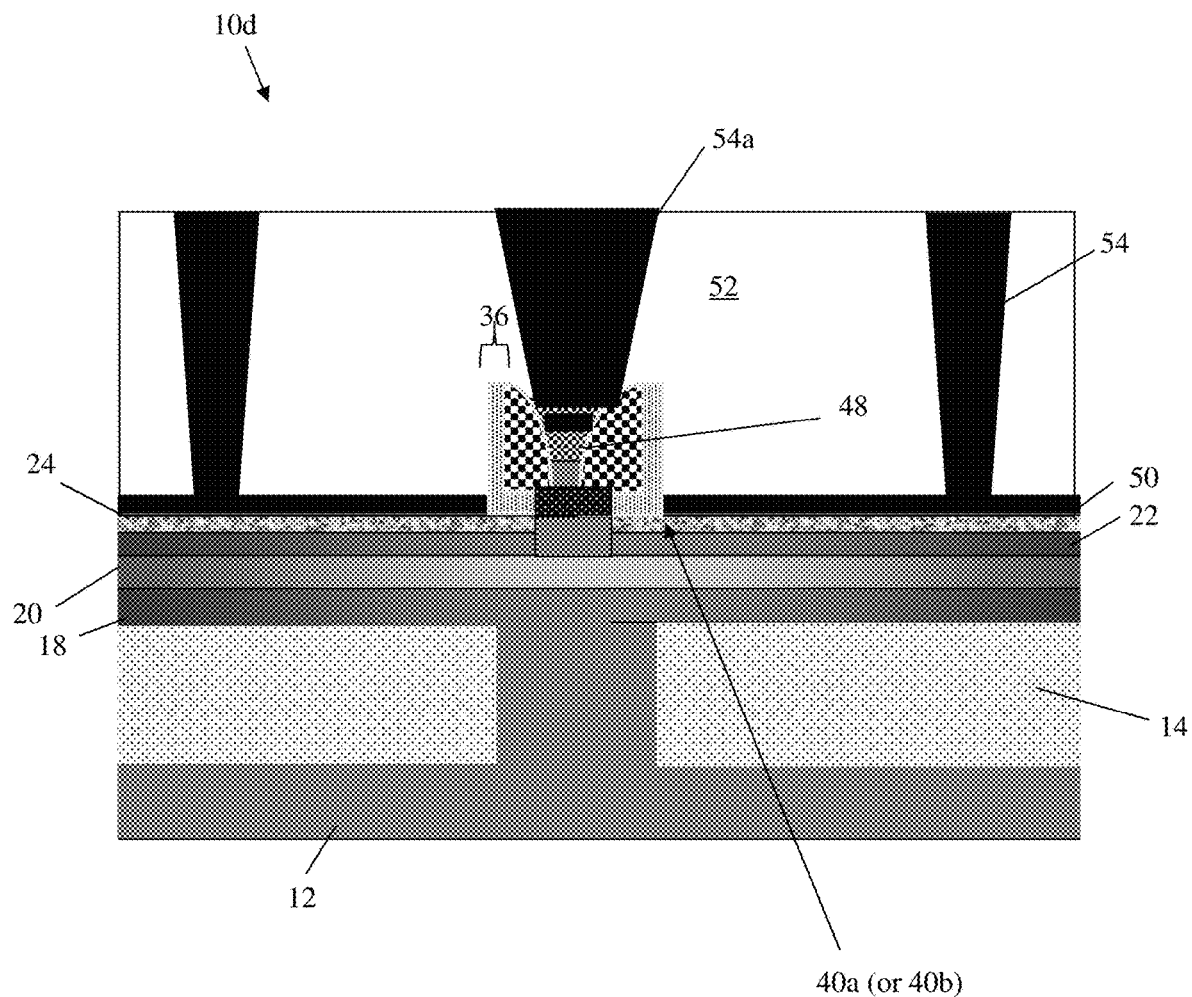
FIG. 11 shows a heterojunction bipolar transistor with a scaled emitter, amongst other features, in accordance with additional aspects of the present disclosure.

FIG. 11 shows a heterojunction bipolar transistor 10*d* which includes a scaled emitter width. In this scaled implementation, the size of the emitter contact 54*a* is limited by middle end line of processes and typically does not scale with width of the emitter 48. Accordingly, in this embodiment, the emitter contact 54*a* will land (e.g., contact) on the sidewall spacer structures 34.

Figure 12A:
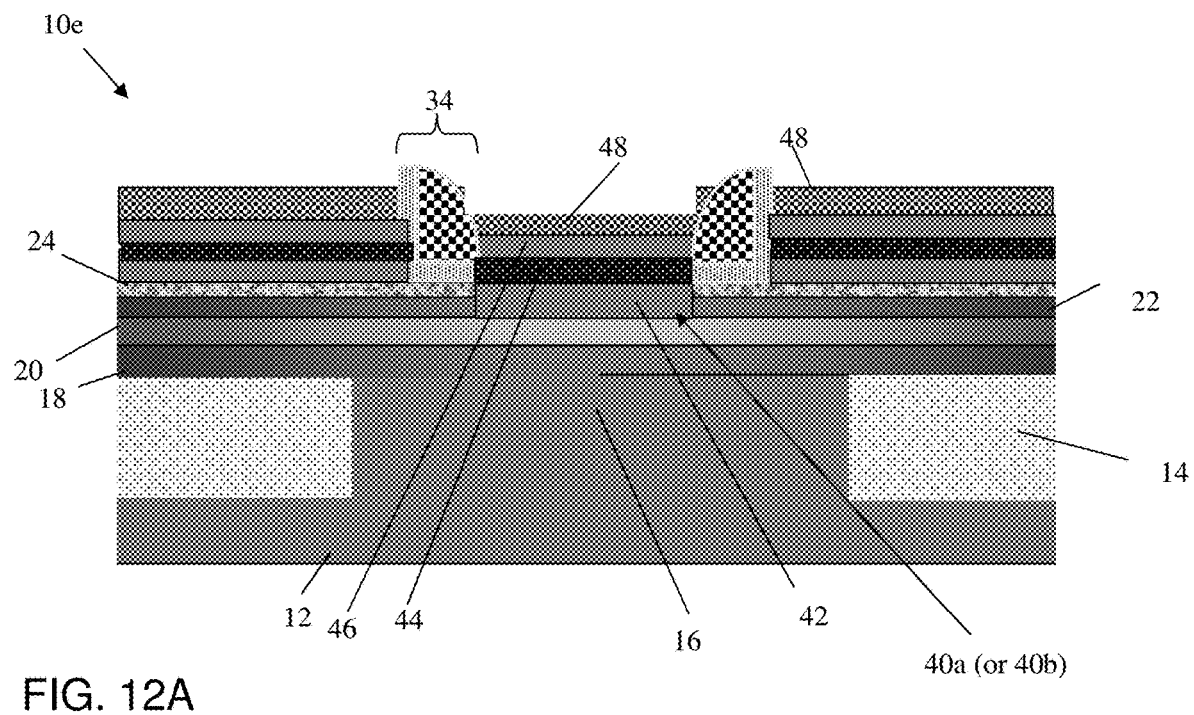
FIGS. 12A and 12B show an intermediate structure of a heterojunction bipolar transistor and respective fabrication processes in accordance with additional aspects of the present disclosure.
Figure 12B:
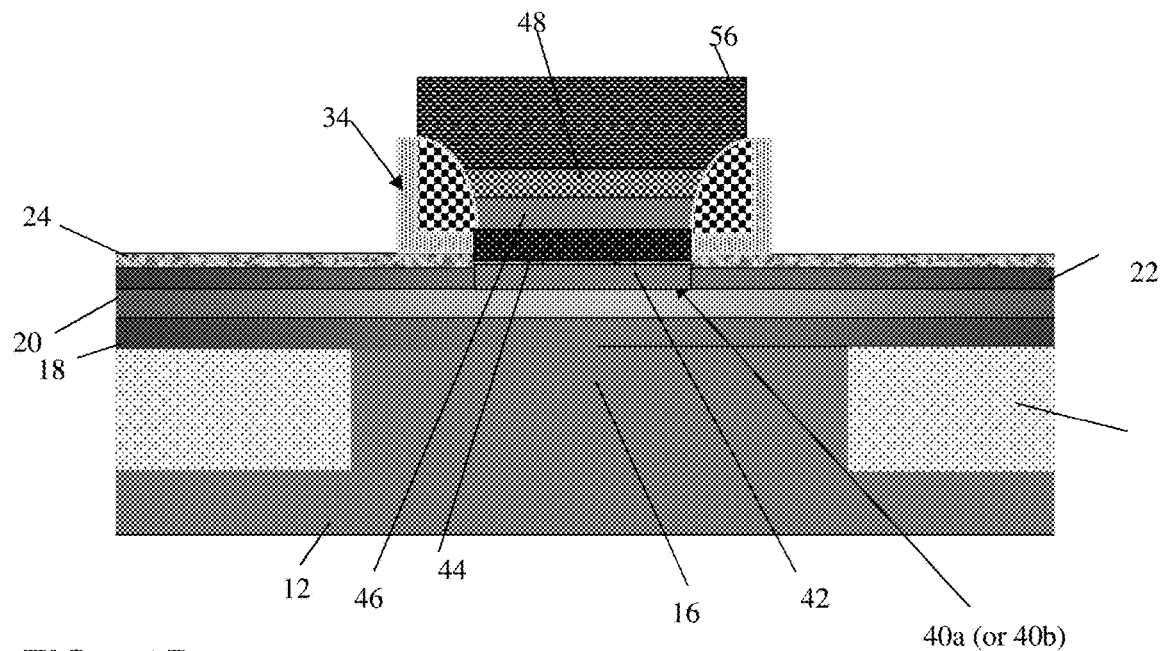

FIGS. 12A and 12B show an intermediate structure 10*e* of a heterojunction bipolar transistor and respective fabrication processes in accordance with additional aspects of the present disclosure. As shown in FIG. 12A, the intermediate structure 10*e* includes epitaxial semiconductor materials 42, 44, 46, 48 gown between and outside of the sidewall spacer structures 34. In this embodiment and starting from either FIG. 5A or FIG. 5B, the insulator material 26 is removed prior to the epitaxial growth process. Following the removal of the insulator material 26, the epitaxial semiconductor materials 42, 44, 46, 48 can be grown on the semiconductor material 22, 24 and on the semiconductor material 20, within the cavity 40*a*, 40*b*.

In FIG. 12B, a photoresist mask 56 is patterned over the emitter material 48 to protect the epitaxial semiconductor materials 42, 44, 46, 48 within the sidewall spacer structures 34 during an etching process. The etching process is then performed to remove the epitaxial semiconductor materials 42, 44, 46, 48 outside of the sidewall spacer structures 34 to expose the extrinsic base 24. The mask 56 is removed by conventional methods such as a conventional ashing or stripping processes. The processes continue with the contact formation as shown, e.g., in FIG. 7.

Figure 13:
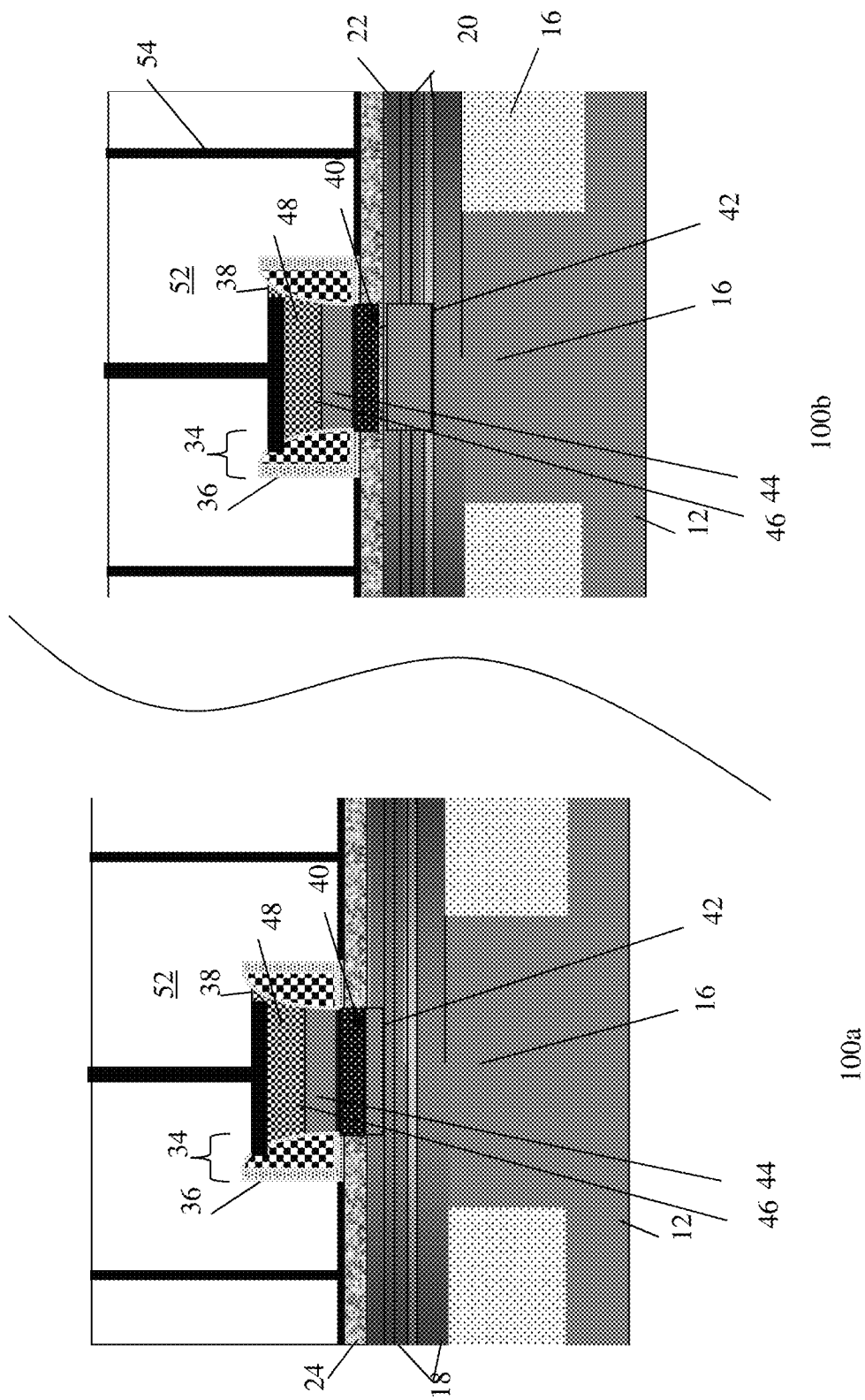
FIG. 13 shows a heterojunction bipolar transistor with different profiles and respective fabrication processes in accordance with additional aspects of the present disclosure.

FIG. 13 shows heterojunction bipolar transistors 100*a*, 100*b* with different profiles in accordance with additional aspects of the present disclosure. In this structure, the heterojunction bipolar transistors 100*a*, 100*b* include two or more marker layers, e.g., two or more layers of epitaxial SiGe material 20 separated by another semiconductor material 18. The different marker layers, epitaxial SiGe material 20, provide different endpoint signals during different etching processes. By having different etching process with different end points signals, it is now possible to form cavities 40, 40*c* of different depths. In this way, the different devices 100*a*, 100*b* can be fabricated with different ft/BV/fmax trade-offs using different profiles of the epitaxial materials grown between within the different cavities 40, 40*c*.

It should be understood by those of skill in the art that the heterojunction bipolar transistor 100*a*, 100*b* with different profiles can also be fabricated with a single marker layer, e.g., one layer of epitaxial SiGe material 20, using the processes shown in FIGS. 5A and 5B. For example, by using an additional masking process, one of the heterojunction bipolar transistor 100*a* can have a first cavity depth by ending the etching process on the marker layer, e.g., epitaxial SiGe material 20, as shown in FIG. 5A; whereas, the other heterojunction bipolar transistor 100*b* can have a different, deeper cavity by ending the etching process after the marker layer as shown in FIG. 5B. In this way, it is possible to obtain the different devices by using only a single epitaxial SiGe material 20.

The heterojunction bipolar transistor can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a collector region composed of semiconductor material;
   at least one marker layer over the collector region;
   a layer of doped semiconductor material which forms an extrinsic base and which is located above the at least one marker layer;
   a cavity formed in the layer of doped semiconductor material and extending at least to the at least one marker layer;
   an epitaxial intrinsic base layer of doped material located within the cavity; and
   an emitter material over the epitaxial intrinsic base layer and within an opening formed by sidewall spacer structures,
   wherein the sidewall spacer structures are located adjacent the cavity on an upper surface of the layer of doped semiconductor material which forms the extrinsic base.

2. The structure of claim 1, wherein:
   the epitaxial intrinsic base layer is located on an undoped semiconductor material within the cavity; and
   the epitaxial intrinsic base layer comprises SiGe material selectively grown over the undoped semiconductor material within the cavity.

3. The structure of claim 2, wherein:
   the epitaxial intrinsic base layer of SiGe and the extrinsic base are laterally connected; and
   the at least one marker layer is underneath the epitaxial intrinsic base layer of SiGe.

4. The structure of claim 1, wherein the cavity extends past the at least one marker layer to an underlying undoped semiconductor material, and the cavity is filled with semiconductor material and the epitaxial intrinsic base layer of doped material.

5. The structure of claim 1, wherein the layer of doped semiconductor material comprises a raised layer of doped semiconductor material forming a raised epitaxial intrinsic base adjacent to the sidewall spacer structures.

6. The structure of claim 1, wherein the layer of doped semiconductor material comprises a raised layer of doped semiconductor material forming a raised epitaxial intrinsic base under the sidewall spacer structures.

7. The structure of claim 1, wherein the layer of doped semiconductor material comprises a raised layer of doped semiconductor material and the cavity includes an undercut within semiconductor material underneath the raised layer of doped semiconductor material.

8. The structure of claim 1, further comprising an emitter contact that extends onto the sidewall spacer structures.

9. The structure of claim 1, wherein the at least one marker layer comprises two or more marker layers and the cavity comprises two cavities of different depths.

10. The structure of claim 1, wherein the cavity stops on the marker layer, the sidewall spacer structures are aligned with the cavity, an undoped semiconductor material and the emitter material are between the sidewall spacer structures above the epitaxial intrinsic base layer that is within the cavity.

11. A structure comprising:
    a substrate;
    a plurality of layers of epitaxially semiconductor material over the substrate with a lower layer of the plurality of layers of epitaxially semiconductor material having a different removal selectivity to at least an upper layer of the plurality of layers of epitaxially semiconductor material;
    a cavity in at least the upper layer of the plurality of layers of epitaxially grown semiconductor material;
    an intrinsic base material formed within the cavity; and
    an emitter material formed over the intrinsic base material
    wherein the plurality of layers of epitaxially semiconductor material include a first layer of undoped epitaxial material, a second layer of epitaxial material that has the different removal selectivity than a third layer of epitaxial material which comprises at least partially doped material and forms an extrinsic base laterally connected to an intrinsic base, and the cavity is in the third layer of epitaxial material and stops on the second layer of epitaxial material.

12. The structure of claim 11, wherein the second layer of epitaxial material comprises SiGe material and the third layer of epitaxial material forms the extrinsic base laterally connected to the intrinsic base material formed within the cavity.

13. The structure of claim 11, wherein the cavity extends below the second layer of epitaxial material.

14. The structure of claim 11, further comprising a raised layer of doped semiconductor material over the plurality of layers of epitaxially semiconductor material, and which forms a raised epitaxial intrinsic base adjacent to sidewall spacer structures of the emitter.

15. The structure of claim 11, further comprising a raised layer of doped semiconductor material over the plurality of layers of epitaxial semiconductor material, and which forms a raised epitaxial intrinsic base underneath sidewall spacer structures of the emitter.

16. The structure of claim 11, wherein the lower layer of the plurality of layers of epitaxially semiconductor material comprises at least a first marker layer and a second marker layer and the cavity comprises two cavities one extending to the first marker layer and another extending to the second marker layer.

17. The structure of claim 11, further comprising an emitter contact that extends onto sidewall spacer structures of the emitter.

18. The structure of claim 11, wherein the cavity is filled with SiGe material that is laterally connected to the upper layer of the plurality of layers of epitaxially semiconductor material.

19. The structure of claim 11, wherein the cavity is filled with undoped semiconductor material, the intrinsic base material over the undoped semiconductor material and another layer of semiconductor material over the intrinsic base material and under the emitter material.

20. A method comprising:
    forming a plurality of layers of epitaxially semiconductor material over a substrate with a lower layer of the plurality of layers of epitaxially semiconductor material having a different removal selectivity to at least an upper layer of the plurality of layers of epitaxially semiconductor material;
    forming sidewall spacer structures on the upper layer of the plurality of layers of epitaxially semiconductor material;

forming a cavity in at least the upper layer of the plurality of layers of epitaxially grown semiconductor material, between and aligned with the sidewall spacer structures;

forming an intrinsic base material within the cavity; and forming an emitter material over the intrinsic base material between the sidewall spacer structures above cavity.

* * * * *